(12) United States Patent
Bergman (10) Patent No.: US 9,740,805 B1
(45) Date of Patent: Aug. 22, 2017

(54) METHOD AND SYSTEM FOR DETECTING HOTSPOTS FOR PHOTOLITHOGRAPHICALLY-DEFINED DEVICES

(71) Applicant: Western Digital (Fremont), LLC, Fremont, CA (US)

(72) Inventor: Bastiaan Bergman, San Jose, CA (US)

(73) Assignee: WESTERN DIGITAL (FREMONT), LLC, Fremont, CA (US)

( * ) Notice: Subject to any disclaimer, the term of this patent is extended or adjusted under 35 U.S.C. 154(b) by 0 days.

(21) Appl. No.: 14/955,904

(22) Filed: Dec. 1, 2015

(51) Int. Cl.
*G06K 9/00* (2006.01)
*G06F 17/50* (2006.01)
*G06F 17/16* (2006.01)

(52) U.S. Cl.
CPC .......... *G06F 17/5009* (2013.01); *G06F 17/16* (2013.01)

(58) Field of Classification Search
CPC ......... H01L 2924/0002; H01L 2924/00; B81C 1/00246; B81C 99/0065; G03F 7/70608; G03F 7/70625; G03F 7/70633
USPC ........................................................ 382/145
See application file for complete search history.

(56) References Cited

U.S. PATENT DOCUMENTS

| | | | |
|---|---|---|---|
| 6,016,290 A | 1/2000 | Chen et al. |
| 6,018,441 A | 1/2000 | Wu et al. |
| 6,025,978 A | 2/2000 | Hoshi et al. |
| 6,025,988 A | 2/2000 | Yan |
| 6,032,353 A | 3/2000 | Hiner et al. |
| 6,033,532 A | 3/2000 | Minami |
| 6,034,851 A | 3/2000 | Zarouri et al. |
| 6,043,959 A | 3/2000 | Crue et al. |
| 6,046,885 A | 4/2000 | Aimonetti et al. |
| 6,049,650 A | 4/2000 | Jerman et al. |
| 6,055,138 A | 4/2000 | Shi |
| 6,058,094 A | 5/2000 | Davis et al. |
| 6,073,338 A | 6/2000 | Liu et al. |
| 6,078,479 A | 6/2000 | Nepela et al. |
| 6,081,499 A | 6/2000 | Berger et al. |
| 6,094,803 A | 8/2000 | Carlson et al. |
| 6,099,362 A | 8/2000 | Viches et al. |
| 6,103,073 A | 8/2000 | Thayamballi |

(Continued)

FOREIGN PATENT DOCUMENTS

| | | |
|---|---|---|
| EP | 1093574 | 1/2000 |
| EP | 2862197 | 12/2013 |
| WO | 2013188232 | 12/2013 |

*Primary Examiner* — Manuchehr Rahmjoo
(74) *Attorney, Agent, or Firm* — Foley & Lardner LLP (57) ABSTRACT

A method detects hot spots from overlay error data for photolithography defined device(s). The overlay error data corresponds to data for sites on a substrate for the photolithography defined device(s). The overlay error data is converted to residual overlay data, which indicates a residual overlay error for each of the sites. The residual overlay error is based on an expected overlay error for each of the sites. It is determined whether group(s) of overlay error sites are present. Each group includes at least two nearest neighbor sites that have the residual overlay error greater than a threshold. For each group of overlay error sites, it is determined whether the group fits a physical model, such as the derivative of a Gaussian, for a hotspot. Each group fitting the physical model is categorized as a hotspot. Hotspot parameters are determined for each group that fits the physical model.

10 Claims, 4 Drawing Sheets

(56) References Cited

U.S. PATENT DOCUMENTS

| | | |
|---|---|---|
| 6,108,166 A | 8/2000 | Lederman |
| 6,118,629 A | 9/2000 | Huai et al. |
| 6,118,638 A | 9/2000 | Knapp et al. |
| 6,125,018 A | 9/2000 | Takagishi et al. |
| 6,130,779 A | 10/2000 | Carlson et al. |
| 6,134,089 A | 10/2000 | Barr et al. |
| 6,136,166 A | 10/2000 | Shen et al. |
| 6,137,661 A | 10/2000 | Shi et al. |
| 6,137,662 A | 10/2000 | Huai et al. |
| 6,160,684 A | 12/2000 | Heist et al. |
| 6,163,426 A | 12/2000 | Nepela et al. |
| 6,166,891 A | 12/2000 | Lederman et al. |
| 6,171,737 B1 | 1/2001 | Phan et al. |
| 6,173,486 B1 | 1/2001 | Hsiao et al. |
| 6,175,476 B1 | 1/2001 | Huai et al. |
| 6,178,066 B1 | 1/2001 | Barr |
| 6,178,070 B1 | 1/2001 | Hong et al. |
| 6,178,150 B1 | 1/2001 | Davis |
| 6,181,485 B1 | 1/2001 | He |
| 6,181,525 B1 | 1/2001 | Carlson |
| 6,185,051 B1 | 2/2001 | Chen et al. |
| 6,185,077 B1 | 2/2001 | Tong et al. |
| 6,185,081 B1 | 2/2001 | Simion et al. |
| 6,188,549 B1 | 2/2001 | Wiitala |
| 6,190,764 B1 | 2/2001 | Shi et al. |
| 6,193,584 B1 | 2/2001 | Rudy et al. |
| 6,195,229 B1 | 2/2001 | Shen et al. |
| 6,198,608 B1 | 3/2001 | Hong et al. |
| 6,198,609 B1 | 3/2001 | Barr et al. |
| 6,201,673 B1 | 3/2001 | Rottmayer et al. |
| 6,204,998 B1 | 3/2001 | Katz |
| 6,204,999 B1 | 3/2001 | Crue et al. |
| 6,212,153 B1 | 4/2001 | Chen et al. |
| 6,215,625 B1 | 4/2001 | Carlson |
| 6,219,205 B1 | 4/2001 | Yuan et al. |
| 6,221,218 B1 | 4/2001 | Shi et al. |
| 6,222,707 B1 | 4/2001 | Huai et al. |
| 6,229,782 B1 | 5/2001 | Wang et al. |
| 6,230,959 B1 | 5/2001 | Heist et al. |
| 6,233,116 B1 | 5/2001 | Chen et al. |
| 6,233,125 B1 | 5/2001 | Knapp et al. |
| 6,237,215 B1 | 5/2001 | Hunsaker et al. |
| 6,252,743 B1 | 6/2001 | Bozorgi |
| 6,255,721 B1 | 7/2001 | Roberts |
| 6,258,468 B1 | 7/2001 | Mahvan et al. |
| 6,266,216 B1 | 7/2001 | Hikami et al. |
| 6,271,604 B1 | 8/2001 | Frank, Jr. et al. |
| 6,275,354 B1 | 8/2001 | Huai et al. |
| 6,277,505 B1 | 8/2001 | Shi et al. |
| 6,282,056 B1 | 8/2001 | Feng et al. |
| 6,296,955 B1 | 10/2001 | Hossain et al. |
| 6,297,955 B1 | 10/2001 | Frank, Jr. et al. |
| 6,304,414 B1 | 10/2001 | Crue, Jr. et al. |
| 6,307,715 B1 | 10/2001 | Berding et al. |
| 6,310,746 B1 | 10/2001 | Hawwa et al. |
| 6,310,750 B1 | 10/2001 | Hawwa et al. |
| 6,317,290 B1 | 11/2001 | Wang et al. |
| 6,317,297 B1 | 11/2001 | Tong et al. |
| 6,322,911 B1 | 11/2001 | Fukagawa et al. |
| 6,324,481 B1 | 11/2001 | Atchison et al. |
| 6,330,136 B1 | 12/2001 | Wang et al. |
| 6,330,137 B1 | 12/2001 | Knapp et al. |
| 6,333,830 B2 | 12/2001 | Rose et al. |
| 6,340,533 B1 | 1/2002 | Ueno et al. |
| 6,349,014 B1 | 2/2002 | Crue, Jr. et al. |
| 6,351,355 B1 | 2/2002 | Min et al. |
| 6,353,318 B1 | 3/2002 | Sin et al. |
| 6,353,511 B1 | 3/2002 | Shi et al. |
| 6,356,412 B1 | 3/2002 | Levi et al. |
| 6,359,779 B1 | 3/2002 | Frank, Jr. et al. |
| 6,367,040 B1 | 4/2002 | Ott et al. |
| 6,369,983 B1 | 4/2002 | Hong |
| 6,376,964 B1 | 4/2002 | Young et al. |
| 6,377,535 B1 | 4/2002 | Chen et al. |
| 6,381,095 B1 | 4/2002 | Sin et al. |
| 6,381,105 B1 | 4/2002 | Huai et al. |
| 6,389,499 B1 | 5/2002 | Frank, Jr. et al. |
| 6,392,850 B1 | 5/2002 | Tong et al. |
| 6,396,660 B1 | 5/2002 | Jensen et al. |
| 6,399,179 B1 | 6/2002 | Hanrahan et al. |
| 6,400,526 B2 | 6/2002 | Crue, Jr. et al. |
| 6,404,600 B1 | 6/2002 | Hawwa et al. |
| 6,404,601 B1 | 6/2002 | Rottmayer et al. |
| 6,404,706 B1 | 6/2002 | Stovall et al. |
| 6,410,170 B1 | 6/2002 | Chen et al. |
| 6,411,522 B1 | 6/2002 | Frank, Jr. et al. |
| 6,417,998 B1 | 7/2002 | Crue, Jr. et al. |
| 6,417,999 B1 | 7/2002 | Knapp et al. |
| 6,418,000 B1 | 7/2002 | Gibbons et al. |
| 6,418,048 B1 | 7/2002 | Sin et al. |
| 6,421,211 B1 | 7/2002 | Hawwa et al. |
| 6,421,212 B1 | 7/2002 | Gibbons et al. |
| 6,424,505 B1 | 7/2002 | Lam et al. |
| 6,424,507 B1 | 7/2002 | Lederman et al. |
| 6,430,009 B1 | 8/2002 | Komaki et al. |
| 6,430,806 B1 | 8/2002 | Chen et al. |
| 6,433,965 B1 | 8/2002 | Gopinathan et al. |
| 6,433,968 B1 | 8/2002 | Shi et al. |
| 6,433,970 B1 | 8/2002 | Knapp et al. |
| 6,437,945 B1 | 8/2002 | Hawwa et al. |
| 6,445,536 B1 | 9/2002 | Rudy et al. |
| 6,445,542 B1 | 9/2002 | Levi et al. |
| 6,445,553 B2 | 9/2002 | Barr et al. |
| 6,445,554 B1 | 9/2002 | Dong et al. |
| 6,447,935 B1 | 9/2002 | Zhang et al. |
| 6,448,765 B1 | 9/2002 | Chen et al. |
| 6,451,514 B1 | 9/2002 | Iitsuka |
| 6,452,742 B1 | 9/2002 | Crue et al. |
| 6,452,765 B1 | 9/2002 | Mahvan et al. |
| 6,456,465 B1 | 9/2002 | Louis et al. |
| 6,459,552 B1 | 10/2002 | Liu et al. |
| 6,462,920 B1 | 10/2002 | Karimi |
| 6,466,401 B1 | 10/2002 | Hong et al. |
| 6,466,402 B1 | 10/2002 | Crue, Jr. et al. |
| 6,466,404 B1 | 10/2002 | Crue, Jr. et al. |
| 6,468,436 B1 | 10/2002 | Shi et al. |
| 6,469,877 B1 | 10/2002 | Knapp et al. |
| 6,477,019 B2 | 11/2002 | Matono et al. |
| 6,479,096 B1 | 11/2002 | Shi et al. |
| 6,483,662 B1 | 11/2002 | Thomas et al. |
| 6,487,040 B1 | 11/2002 | Hsiao et al. |
| 6,487,056 B1 | 11/2002 | Gibbons et al. |
| 6,490,125 B1 | 12/2002 | Barr |
| 6,496,330 B1 | 12/2002 | Crue, Jr. et al. |
| 6,496,334 B1 | 12/2002 | Pang et al. |
| 6,504,676 B1 | 1/2003 | Hiner et al. |
| 6,507,933 B1 | 1/2003 | Kirsch et al. |
| 6,512,657 B2 | 1/2003 | Heist et al. |
| 6,512,659 B1 | 1/2003 | Hawwa et al. |
| 6,512,661 B1 | 1/2003 | Louis |
| 6,512,690 B1 | 1/2003 | Qi et al. |
| 6,515,573 B1 | 2/2003 | Dong et al. |
| 6,515,791 B1 | 2/2003 | Hawwa et al. |
| 6,532,823 B1 | 3/2003 | Knapp et al. |
| 6,535,363 B1 | 3/2003 | Hosomi et al. |
| 6,552,874 B1 | 4/2003 | Chen et al. |
| 6,552,928 B1 | 4/2003 | Qi et al. |
| 6,577,470 B1 | 6/2003 | Rumpler |
| 6,583,961 B2 | 6/2003 | Levi et al. |
| 6,583,968 B1 | 6/2003 | Scura et al. |
| 6,597,548 B1 | 7/2003 | Yamanaka et al. |
| 6,611,398 B1 | 8/2003 | Rumpler et al. |
| 6,618,223 B1 | 9/2003 | Chen et al. |
| 6,629,357 B1 | 10/2003 | Akoh |
| 6,633,464 B2 | 10/2003 | Lai et al. |
| 6,636,394 B1 | 10/2003 | Fukagawa et al. |
| 6,639,291 B1 | 10/2003 | Sin et al. |
| 6,650,503 B1 | 11/2003 | Chen et al. |
| 6,650,506 B1 | 11/2003 | Risse |
| 6,654,195 B1 | 11/2003 | Frank, Jr. et al. |
| 6,657,816 B1 | 12/2003 | Barr et al. |
| 6,661,621 B1 | 12/2003 | Iitsuka |
| 6,661,625 B1 | 12/2003 | Sin et al. |
| 6,674,610 B1 | 1/2004 | Thomas et al. |

(56) References Cited

U.S. PATENT DOCUMENTS

| | | |
|---|---|---|
| 6,680,863 B1 | 1/2004 | Shi et al. |
| 6,683,763 B1 | 1/2004 | Hiner et al. |
| 6,687,098 B1 | 2/2004 | Huai |
| 6,687,178 B1 | 2/2004 | Qi et al. |
| 6,687,977 B2 | 2/2004 | Knapp et al. |
| 6,691,226 B1 | 2/2004 | Frank, Jr. et al. |
| 6,697,294 B1 | 2/2004 | Qi et al. |
| 6,700,738 B1 | 3/2004 | Sin et al. |
| 6,700,759 B1 | 3/2004 | Knapp et al. |
| 6,704,158 B2 | 3/2004 | Hawwa et al. |
| 6,707,083 B1 | 3/2004 | Hiner et al. |
| 6,713,801 B1 | 3/2004 | Sin et al. |
| 6,721,138 B1 | 4/2004 | Chen et al. |
| 6,721,149 B1 | 4/2004 | Shi et al. |
| 6,721,203 B1 | 4/2004 | Qi et al. |
| 6,724,569 B1 | 4/2004 | Chen et al. |
| 6,724,572 B1 | 4/2004 | Stoev et al. |
| 6,729,015 B2 | 5/2004 | Matono et al. |
| 6,735,850 B1 | 5/2004 | Gibbons et al. |
| 6,737,281 B1 | 5/2004 | Dang et al. |
| 6,744,608 B1 | 6/2004 | Sin et al. |
| 6,747,301 B1 | 6/2004 | Hiner et al. |
| 6,751,055 B1 | 6/2004 | Alfoqaha et al. |
| 6,754,049 B1 | 6/2004 | Seagle et al. |
| 6,756,071 B1 | 6/2004 | Shi et al. |
| 6,757,140 B1 | 6/2004 | Hawwa |
| 6,760,196 B1 | 7/2004 | Niu et al. |
| 6,762,910 B1 | 7/2004 | Knapp et al. |
| 6,765,756 B1 | 7/2004 | Hong et al. |
| 6,775,902 B1 | 8/2004 | Huai et al. |
| 6,778,358 B1 | 8/2004 | Jiang et al. |
| 6,781,927 B1 | 8/2004 | Heanuc et al. |
| 6,785,955 B1 | 9/2004 | Chen et al. |
| 6,791,793 B1 | 9/2004 | Chen et al. |
| 6,791,807 B1 | 9/2004 | Hikami et al. |
| 6,798,616 B1 | 9/2004 | Seagle et al. |
| 6,798,625 B1 | 9/2004 | Ueno et al. |
| 6,801,408 B1 | 10/2004 | Chen et al. |
| 6,801,411 B1 | 10/2004 | Lederman et al. |
| 6,803,615 B1 | 10/2004 | Sin et al. |
| 6,806,035 B1 | 10/2004 | Atireklapvarodom et al. |
| 6,807,030 B1 | 10/2004 | Hawwa et al. |
| 6,807,332 B1 | 10/2004 | Hawwa |
| 6,809,899 B1 | 10/2004 | Chen et al. |
| 6,816,345 B1 | 11/2004 | Knapp et al. |
| 6,828,897 B1 | 12/2004 | Nepela |
| 6,829,160 B1 | 12/2004 | Qi et al. |
| 6,829,819 B1 | 12/2004 | Crue, Jr. et al. |
| 6,833,979 B1 | 12/2004 | Knapp et al. |
| 6,834,010 B1 | 12/2004 | Qi et al. |
| 6,859,343 B1 | 2/2005 | Alfoqaha et al. |
| 6,859,997 B1 | 3/2005 | Tong et al. |
| 6,861,937 B1 | 3/2005 | Feng et al. |
| 6,870,712 B2 | 3/2005 | Chen et al. |
| 6,873,494 B2 | 3/2005 | Chen et al. |
| 6,873,547 B1 | 3/2005 | Shi et al. |
| 6,879,464 B2 | 4/2005 | Sun et al. |
| 6,888,184 B1 | 5/2005 | Shi et al. |
| 6,888,704 B1 | 5/2005 | Diao et al. |
| 6,891,702 B1 | 5/2005 | Tang |
| 6,894,871 B2 | 5/2005 | Alfoqaha et al. |
| 6,894,877 B1 | 5/2005 | Crue, Jr. et al. |
| 6,906,894 B2 | 6/2005 | Chen et al. |
| 6,909,578 B1 | 6/2005 | Missell et al. |
| 6,912,106 B1 | 6/2005 | Chen et al. |
| 6,934,113 B1 | 8/2005 | Chen |
| 6,934,129 B1 | 8/2005 | Zhang et al. |
| 6,940,688 B2 | 9/2005 | Jiang et al. |
| 6,942,824 B1 | 9/2005 | Li |
| 6,943,993 B2 | 9/2005 | Chang et al. |
| 6,944,938 B1 | 9/2005 | Crue, Jr. et al. |
| 6,947,258 B1 | 9/2005 | Li |
| 6,950,266 B1 | 9/2005 | McCaslin et al. |
| 6,954,332 B1 | 10/2005 | Hong et al. |
| 6,958,885 B1 | 10/2005 | Chen et al. |
| 6,961,221 B1 | 11/2005 | Niu et al. |
| 6,969,989 B1 | 11/2005 | Mei |
| 6,975,486 B2 | 12/2005 | Chen et al. |
| 6,987,643 B1 | 1/2006 | Seagle |
| 6,989,962 B1 | 1/2006 | Dong et al. |
| 6,989,972 B1 | 1/2006 | Stoev et al. |
| 7,006,327 B2 | 2/2006 | Krounbi et al. |
| 7,007,372 B1 | 3/2006 | Chen et al. |
| 7,012,832 B1 | 3/2006 | Sin et al. |
| 7,023,658 B1 | 4/2006 | Knapp et al. |
| 7,026,063 B2 | 4/2006 | Ueno et al. |
| 7,027,268 B1 | 4/2006 | Zhu et al. |
| 7,027,274 B1 | 4/2006 | Sin et al. |
| 7,035,046 B1 | 4/2006 | Young et al. |
| 7,041,985 B1 | 5/2006 | Wang et al. |
| 7,046,490 B1 | 5/2006 | Ueno et al. |
| 7,054,113 B1 | 5/2006 | Seagle et al. |
| 7,057,857 B1 | 6/2006 | Niu et al. |
| 7,059,868 B1 | 6/2006 | Yan |
| 7,092,195 B1 | 8/2006 | Liu et al. |
| 7,110,289 B1 | 9/2006 | Sin et al. |
| 7,111,382 B1 | 9/2006 | Knapp et al. |
| 7,113,366 B1 | 9/2006 | Wang et al. |
| 7,114,241 B2 | 10/2006 | Kubota et al. |
| 7,116,517 B1 | 10/2006 | He et al. |
| 7,124,654 B1 | 10/2006 | Davies et al. |
| 7,126,788 B1 | 10/2006 | Liu et al. |
| 7,126,790 B1 | 10/2006 | Liu et al. |
| 7,131,346 B1 | 11/2006 | Buttar et al. |
| 7,133,253 B1 | 11/2006 | Seagle et al. |
| 7,134,185 B1 | 11/2006 | Knapp et al. |
| 7,154,715 B2 | 12/2006 | Yamanaka et al. |
| 7,170,725 B1 | 1/2007 | Zhou et al. |
| 7,177,117 B1 | 2/2007 | Jiang et al. |
| 7,193,815 B1 | 3/2007 | Stoev et al. |
| 7,196,880 B1 | 3/2007 | Anderson et al. |
| 7,199,974 B1 | 4/2007 | Alfoqaha |
| 7,199,975 B1 | 4/2007 | Pan |
| 7,211,339 B1 | 5/2007 | Seagle et al. |
| 7,212,384 B1 | 5/2007 | Stoev et al. |
| 7,229,845 B1 | 6/2007 | Luu et al. |
| 7,238,292 B1 | 7/2007 | He et al. |
| 7,239,478 B1 | 7/2007 | Sin et al. |
| 7,248,431 B1 | 7/2007 | Liu et al. |
| 7,248,433 B1 | 7/2007 | Stoev et al. |
| 7,248,449 B1 | 7/2007 | Seagle |
| 7,280,325 B1 | 10/2007 | Pan |
| 7,283,327 B1 | 10/2007 | Liu et al. |
| 7,284,316 B1 | 10/2007 | Huai et al. |
| 7,286,329 B1 | 10/2007 | Chen et al. |
| 7,289,303 B1 | 10/2007 | Sin et al. |
| 7,292,409 B1 | 11/2007 | Stoev et al. |
| 7,296,339 B1 | 11/2007 | Yang et al. |
| 7,307,814 B1 | 12/2007 | Seagle et al. |
| 7,307,818 B1 | 12/2007 | Park et al. |
| 7,310,204 B1 | 12/2007 | Stoev et al. |
| 7,318,947 B1 | 1/2008 | Park et al. |
| 7,333,295 B1 | 2/2008 | Medina et al. |
| 7,337,530 B1 | 3/2008 | Stoev et al. |
| 7,342,752 B1 | 3/2008 | Zhang et al. |
| 7,349,170 B1 | 3/2008 | Rudman et al. |
| 7,349,179 B1 | 3/2008 | He et al. |
| 7,354,664 B1 | 4/2008 | Jiang et al. |
| 7,363,697 B1 | 4/2008 | Dunn et al. |
| 7,371,152 B1 | 5/2008 | Newman |
| 7,372,665 B1 | 5/2008 | Stoev et al. |
| 7,375,926 B1 | 5/2008 | Stoev et al. |
| 7,379,269 B1 | 5/2008 | Krounbi et al. |
| 7,386,933 B1 | 6/2008 | Krounbi et al. |
| 7,389,577 B1 | 6/2008 | Shang et al. |
| 7,417,832 B1 | 8/2008 | Erickson et al. |
| 7,419,891 B1 | 9/2008 | Chen et al. |
| 7,428,124 B1 | 9/2008 | Song et al. |
| 7,430,098 B1 | 9/2008 | Song et al. |
| 7,436,620 B1 | 10/2008 | Kang et al. |
| 7,436,638 B1 | 10/2008 | Pan |
| 7,440,220 B1 | 10/2008 | Kang et al. |
| 7,443,632 B1 | 10/2008 | Stoev et al. |
| 7,444,740 B1 | 11/2008 | Chung et al. |

(56) References Cited

U.S. PATENT DOCUMENTS

| | | |
|---|---|---|
| 7,493,688 B1 | 2/2009 | Wang et al. |
| 7,508,627 B1 | 3/2009 | Zhang et al. |
| 7,522,377 B1 | 4/2009 | Jiang et al. |
| 7,522,379 B1 | 4/2009 | Krounbi et al. |
| 7,522,382 B1 | 4/2009 | Pan |
| 7,542,246 B1 | 6/2009 | Song et al. |
| 7,551,406 B1 | 6/2009 | Thomas et al. |
| 7,552,523 B1 | 6/2009 | He et al. |
| 7,554,767 B1 | 6/2009 | Hu et al. |
| 7,570,797 B1 | 8/2009 | Wang et al. |
| 7,583,466 B2 | 9/2009 | Kermiche et al. |
| 7,595,967 B1 | 9/2009 | Moon et al. |
| 7,639,457 B1 | 12/2009 | Chen et al. |
| 7,660,080 B1 | 2/2010 | Liu et al. |
| 7,672,080 B1 | 3/2010 | Tang et al. |
| 7,672,086 B1 | 3/2010 | Jiang |
| 7,684,160 B1 | 3/2010 | Erickson et al. |
| 7,688,546 B1 | 3/2010 | Bai et al. |
| 7,691,434 B1 | 4/2010 | Zhang et al. |
| 7,693,323 B2 | 4/2010 | Levin et al. |
| 7,695,761 B1 | 4/2010 | Shen et al. |
| 7,719,795 B2 | 5/2010 | Hu et al. |
| 7,726,009 B1 | 6/2010 | Liu et al. |
| 7,729,086 B1 | 6/2010 | Song et al. |
| 7,729,087 B1 | 6/2010 | Stoev et al. |
| 7,736,823 B1 | 6/2010 | Wang et al. |
| 7,785,666 B1 | 8/2010 | Sun et al. |
| 7,796,356 B1 | 9/2010 | Fowler et al. |
| 7,800,858 B1 | 9/2010 | Bajikar et al. |
| 7,819,979 B1 | 10/2010 | Chen et al. |
| 7,829,264 B1 | 11/2010 | Wang et al. |
| 7,846,643 B1 | 12/2010 | Sun et al. |
| 7,855,854 B2 | 12/2010 | Hu et al. |
| 7,869,160 B1 | 1/2011 | Pan et al. |
| 7,872,824 B1 | 1/2011 | Macchioni et al. |
| 7,872,833 B2 | 1/2011 | Hu et al. |
| 7,910,267 B1 | 3/2011 | Zeng et al. |
| 7,911,735 B1 | 3/2011 | Sin et al. |
| 7,911,737 B1 | 3/2011 | Jiang et al. |
| 7,916,426 B2 | 3/2011 | Hu et al. |
| 7,918,013 B1 | 4/2011 | Dunn et al. |
| 7,968,219 B1 | 6/2011 | Jiang et al. |
| 7,982,989 B1 | 7/2011 | Shi et al. |
| 8,008,912 B1 | 8/2011 | Shang |
| 8,012,804 B1 | 9/2011 | Wang et al. |
| 8,015,692 B1 | 9/2011 | Zhang et al. |
| 8,018,677 B1 | 9/2011 | Chung et al. |
| 8,018,678 B1 | 9/2011 | Zhang et al. |
| 8,024,748 B1 | 9/2011 | Moravec et al. |
| 8,072,705 B1 | 12/2011 | Wang et al. |
| 8,074,345 B1 | 12/2011 | Anguelouch et al. |
| 8,077,418 B1 | 12/2011 | Hu et al. |
| 8,077,434 B1 | 12/2011 | Shen et al. |
| 8,077,435 B1 | 12/2011 | Liu et al. |
| 8,077,557 B1 | 12/2011 | Hu et al. |
| 8,079,135 B1 | 12/2011 | Shen et al. |
| 8,081,403 B1 | 12/2011 | Chen et al. |
| 8,091,210 B1 | 1/2012 | Sasaki et al. |
| 8,097,846 B1 | 1/2012 | Anguelouch et al. |
| 8,104,166 B1 | 1/2012 | Zhang et al. |
| 8,116,043 B2 | 2/2012 | Leng et al. |
| 8,116,171 B1 | 2/2012 | Lee |
| 8,125,856 B1 | 2/2012 | Li et al. |
| 8,134,794 B1 | 3/2012 | Wang |
| 8,136,224 B1 | 3/2012 | Sun et al. |
| 8,136,225 B1 | 3/2012 | Zhang et al. |
| 8,136,805 B1 | 3/2012 | Lee |
| 8,141,235 B1 | 3/2012 | Zhang |
| 8,146,236 B1 | 4/2012 | Luo et al. |
| 8,149,536 B1 | 4/2012 | Yang et al. |
| 8,151,441 B1 | 4/2012 | Rudy et al. |
| 8,163,185 B1 | 4/2012 | Sun et al. |
| 8,164,760 B2 | 4/2012 | Willis |
| 8,164,855 B1 | 4/2012 | Gibbons et al. |
| 8,164,864 B2 | 4/2012 | Kaiser et al. |
| 8,165,709 B1 | 4/2012 | Rudy |
| 8,166,631 B1 | 5/2012 | Tran et al. |
| 8,166,632 B1 | 5/2012 | Zhang et al. |
| 8,169,473 B1 | 5/2012 | Yu et al. |
| 8,171,618 B1 | 5/2012 | Wang et al. |
| 8,179,636 B1 | 5/2012 | Bai et al. |
| 8,191,237 B1 | 6/2012 | Luo et al. |
| 8,194,365 B1 | 6/2012 | Leng et al. |
| 8,194,366 B1 | 6/2012 | Li et al. |
| 8,196,285 B1 | 6/2012 | Zhang et al. |
| 8,200,054 B1 | 6/2012 | Li et al. |
| 8,203,800 B2 | 6/2012 | Li et al. |
| 8,208,350 B1 | 6/2012 | Hu et al. |
| 8,220,140 B1 | 7/2012 | Wang et al. |
| 8,222,599 B1 | 7/2012 | Chien |
| 8,225,488 B1 | 7/2012 | Zhang et al. |
| 8,227,023 B1 | 7/2012 | Liu et al. |
| 8,228,633 B1 | 7/2012 | Tran et al. |
| 8,231,796 B1 | 7/2012 | Li et al. |
| 8,233,248 B1 | 7/2012 | Li et al. |
| 8,248,896 B1 | 8/2012 | Yuan et al. |
| 8,254,060 B1 | 8/2012 | Shi et al. |
| 8,257,597 B1 | 9/2012 | Guan et al. |
| 8,259,410 B1 | 9/2012 | Bai et al. |
| 8,259,539 B1 | 9/2012 | Hu et al. |
| 8,262,918 B1 | 9/2012 | Li et al. |
| 8,262,919 B1 | 9/2012 | Luo et al. |
| 8,264,797 B2 | 9/2012 | Emley |
| 8,264,798 B1 | 9/2012 | Guan et al. |
| 8,270,126 B1 | 9/2012 | Roy et al. |
| 8,276,258 B1 | 10/2012 | Tran et al. |
| 8,277,669 B1 | 10/2012 | Chen et al. |
| 8,279,719 B1 | 10/2012 | Hu et al. |
| 8,284,517 B1 | 10/2012 | Sun et al. |
| 8,288,204 B1 | 10/2012 | Wang et al. |
| 8,289,821 B1 | 10/2012 | Huber |
| 8,291,743 B1 | 10/2012 | Shi et al. |
| 8,307,539 B1 | 11/2012 | Rudy et al. |
| 8,307,540 B1 | 11/2012 | Tran et al. |
| 8,308,921 B1 | 11/2012 | Hiner et al. |
| 8,310,785 B1 | 11/2012 | Zhang et al. |
| 8,310,901 B1 | 11/2012 | Batra et al. |
| 8,315,019 B1 | 11/2012 | Mao et al. |
| 8,316,527 B2 | 11/2012 | Hong et al. |
| 8,320,076 B1 | 11/2012 | Shen et al. |
| 8,320,077 B1 | 11/2012 | Tang et al. |
| 8,320,219 B1 | 11/2012 | Wolf et al. |
| 8,320,220 B1 | 11/2012 | Yuan et al. |
| 8,320,722 B1 | 11/2012 | Yuan et al. |
| 8,322,022 B1 | 12/2012 | Yi et al. |
| 8,322,023 B1 | 12/2012 | Zeng et al. |
| 8,325,569 B1 | 12/2012 | Shi et al. |
| 8,333,008 B1 | 12/2012 | Sin et al. |
| 8,334,093 B2 | 12/2012 | Zhang et al. |
| 8,336,194 B2 | 12/2012 | Yuan et al. |
| 8,339,738 B1 | 12/2012 | Tran et al. |
| 8,341,826 B1 | 1/2013 | Jiang et al. |
| 8,343,319 B1 | 1/2013 | Li et al. |
| 8,343,364 B1 | 1/2013 | Gao et al. |
| 8,349,195 B1 | 1/2013 | Si et al. |
| 8,351,307 B1 | 1/2013 | Wolf et al. |
| 8,357,244 B1 | 1/2013 | Zhao et al. |
| 8,373,945 B1 | 2/2013 | Luo et al. |
| 8,375,564 B1 | 2/2013 | Luo et al. |
| 8,375,565 B2 | 2/2013 | Hu et al. |
| 8,381,391 B2 | 2/2013 | Park et al. |
| 8,385,157 B1 | 2/2013 | Champion et al. |
| 8,385,158 B1 | 2/2013 | Hu et al. |
| 8,394,280 B1 | 3/2013 | Wan et al. |
| 8,400,731 B1 | 3/2013 | Li et al. |
| 8,404,128 B1 | 3/2013 | Zhang et al. |
| 8,404,129 B1 | 3/2013 | Luo et al. |
| 8,405,930 B1 | 3/2013 | Li et al. |
| 8,409,453 B1 | 4/2013 | Jiang et al. |
| 8,413,317 B1 | 4/2013 | Wan et al. |
| 8,416,540 B1 | 4/2013 | Li et al. |
| 8,419,953 B1 | 4/2013 | Su et al. |
| 8,419,954 B1 | 4/2013 | Chen et al. |
| 8,422,176 B1 | 4/2013 | Leng et al. |

(56) References Cited

U.S. PATENT DOCUMENTS

| | | |
|---|---|---|
| 8,422,342 B1 | 4/2013 | Lee |
| 8,422,841 B1 | 4/2013 | Shi et al. |
| 8,424,192 B1 | 4/2013 | Yang et al. |
| 8,441,756 B1 | 5/2013 | Sun et al. |
| 8,443,510 B1 | 5/2013 | Shi et al. |
| 8,444,866 B1 | 5/2013 | Guan et al. |
| 8,449,948 B2 | 5/2013 | Medina et al. |
| 8,451,556 B1 | 5/2013 | Wang et al. |
| 8,451,563 B1 | 5/2013 | Zhang et al. |
| 8,454,846 B1 | 6/2013 | Zhou et al. |
| 8,455,119 B1 | 6/2013 | Jiang et al. |
| 8,456,961 B1 | 6/2013 | Wang et al. |
| 8,456,963 B1 | 6/2013 | Hu et al. |
| 8,456,964 B1 | 6/2013 | Yuan et al. |
| 8,456,966 B1 | 6/2013 | Shi et al. |
| 8,456,967 B1 | 6/2013 | Mallary |
| 8,458,892 B2 | 6/2013 | Si et al. |
| 8,462,592 B1 | 6/2013 | Wolf et al. |
| 8,468,682 B1 | 6/2013 | Zhang |
| 8,472,288 B1 | 6/2013 | Wolf et al. |
| 8,480,911 B1 | 7/2013 | Osugi et al. |
| 8,486,285 B2 | 7/2013 | Zhou et al. |
| 8,486,286 B1 | 7/2013 | Gao et al. |
| 8,488,272 B1 | 7/2013 | Tran et al. |
| 8,491,801 B1 | 7/2013 | Tanner et al. |
| 8,491,802 B1 | 7/2013 | Gao et al. |
| 8,493,693 B1 | 7/2013 | Zheng et al. |
| 8,493,695 B1 | 7/2013 | Kaiser et al. |
| 8,495,813 B1 | 7/2013 | Hu et al. |
| 8,498,084 B1 | 7/2013 | Leng et al. |
| 8,506,828 B1 | 8/2013 | Osugi et al. |
| 8,514,517 B1 | 8/2013 | Batra et al. |
| 8,518,279 B1 | 8/2013 | Wang et al. |
| 8,518,832 B1 | 8/2013 | Yang et al. |
| 8,520,336 B1 | 8/2013 | Liu et al. |
| 8,520,337 B1 | 8/2013 | Liu et al. |
| 8,524,068 B2 | 9/2013 | Medina et al. |
| 8,526,275 B1 | 9/2013 | Yuan et al. |
| 8,531,801 B1 | 9/2013 | Xiao et al. |
| 8,532,450 B1 | 9/2013 | Wang et al. |
| 8,533,937 B1 | 9/2013 | Wang et al. |
| 8,537,494 B1 | 9/2013 | Pan et al. |
| 8,537,495 B1 | 9/2013 | Luo et al. |
| 8,537,502 B1 | 9/2013 | Park et al. |
| 8,545,999 B1 | 10/2013 | Leng et al. |
| 8,547,659 B1 | 10/2013 | Bai et al. |
| 8,547,667 B1 | 10/2013 | Roy et al. |
| 8,547,730 B1 | 10/2013 | Shen et al. |
| 8,555,486 B1 | 10/2013 | Medina et al. |
| 8,559,141 B1 | 10/2013 | Pakala et al. |
| 8,563,146 B1 | 10/2013 | Zhang et al. |
| 8,565,049 B1 | 10/2013 | Tanner et al. |
| 8,576,517 B1 | 11/2013 | Tran et al. |
| 8,578,594 B2 | 11/2013 | Jiang et al. |
| 8,582,238 B1 | 11/2013 | Liu et al. |
| 8,582,241 B1 | 11/2013 | Yu et al. |
| 8,582,253 B1 | 11/2013 | Zheng et al. |
| 8,588,039 B1 | 11/2013 | Shi et al. |
| 8,593,914 B2 | 11/2013 | Wang et al. |
| 8,597,528 B1 | 12/2013 | Roy et al. |
| 8,599,520 B1 | 12/2013 | Liu et al. |
| 8,599,657 B1 | 12/2013 | Lee |
| 8,603,593 B1 | 12/2013 | Roy et al. |
| 8,607,438 B1 | 12/2013 | Gao et al. |
| 8,607,439 B1 | 12/2013 | Wang et al. |
| 8,611,035 B1 | 12/2013 | Bajikar et al. |
| 8,611,054 B1 | 12/2013 | Shang et al. |
| 8,611,055 B1 | 12/2013 | Pakala et al. |
| 8,614,864 B1 | 12/2013 | Hong et al. |
| 8,619,512 B1 | 12/2013 | Yuan et al. |
| 8,625,233 B1 | 1/2014 | Ji et al. |
| 8,625,941 B1 | 1/2014 | Shi et al. |
| 8,628,672 B1 | 1/2014 | Si et al. |
| 8,630,068 B1 | 1/2014 | Mauri et al. |
| 8,634,280 B1 | 1/2014 | Wang et al. |
| 8,638,529 B1 | 1/2014 | Leng et al. |
| 8,643,980 B1 | 2/2014 | Fowler et al. |
| 8,649,123 B1 | 2/2014 | Zhang et al. |
| 8,665,561 B1 | 3/2014 | Knutson et al. |
| 8,670,211 B1 | 3/2014 | Sun et al. |
| 8,670,213 B1 | 3/2014 | Zeng et al. |
| 8,670,214 B1 | 3/2014 | Knutson et al. |
| 8,670,294 B1 | 3/2014 | Shi et al. |
| 8,670,295 B1 | 3/2014 | Hu et al. |
| 8,675,318 B1 | 3/2014 | Ho et al. |
| 8,675,455 B1 | 3/2014 | Krichevsky et al. |
| 8,681,594 B1 | 3/2014 | Shi et al. |
| 8,689,430 B1 | 4/2014 | Chen et al. |
| 8,693,141 B1 | 4/2014 | Elliott et al. |
| 8,703,397 B1 | 4/2014 | Zeng et al. |
| 8,705,205 B1 | 4/2014 | Li et al. |
| 8,711,518 B1 | 4/2014 | Zeng et al. |
| 8,711,528 B1 | 4/2014 | Xiao et al. |
| 8,717,709 B1 | 5/2014 | Shi et al. |
| 8,720,044 B1 | 5/2014 | Tran et al. |
| 8,721,902 B1 | 5/2014 | Wang et al. |
| 8,724,259 B1 | 5/2014 | Liu et al. |
| 8,749,790 B1 | 6/2014 | Tanner et al. |
| 8,749,920 B1 | 6/2014 | Knutson et al. |
| 8,753,903 B1 | 6/2014 | Tanner et al. |
| 8,760,807 B1 | 6/2014 | Zhang et al. |
| 8,760,818 B1 | 6/2014 | Diao et al. |
| 8,760,819 B1 | 6/2014 | Liu et al. |
| 8,760,822 B1 | 6/2014 | Li et al. |
| 8,760,823 B1 | 6/2014 | Chen et al. |
| 8,763,235 B1 | 7/2014 | Wang et al. |
| 8,780,498 B1 | 7/2014 | Jiang et al. |
| 8,780,505 B1 | 7/2014 | Xiao |
| 8,786,983 B1 | 7/2014 | Liu et al. |
| 8,790,524 B1 | 7/2014 | Luo et al. |
| 8,790,527 B1 | 7/2014 | Luo et al. |
| 8,792,208 B1 | 7/2014 | Liu et al. |
| 8,792,312 B1 | 7/2014 | Wang et al. |
| 8,793,866 B1 | 8/2014 | Zhang et al. |
| 8,797,680 B1 | 8/2014 | Luo et al. |
| 8,797,684 B1 | 8/2014 | Tran et al. |
| 8,797,686 B1 | 8/2014 | Bai et al. |
| 8,797,692 B1 | 8/2014 | Guo et al. |
| 8,799,831 B2 | 8/2014 | Nehmadi et al. |
| 8,813,324 B2 | 8/2014 | Emley et al. |
| 8,953,869 B2 | 2/2015 | Nasser-Ghodsi et al. |
| 2007/0288219 A1* | 12/2007 | Zafar ............... G03F 1/84 703/14 |
| 2010/0290157 A1 | 11/2010 | Zhang et al. |
| 2011/0086240 A1 | 4/2011 | Xiang et al. |
| 2012/0111826 A1 | 5/2012 | Chen et al. |
| 2012/0216378 A1 | 8/2012 | Emley et al. |
| 2012/0237878 A1 | 9/2012 | Zeng et al. |
| 2012/0298621 A1 | 11/2012 | Gao |
| 2013/0216702 A1 | 8/2013 | Kaiser et al. |
| 2013/0216863 A1 | 8/2013 | Li et al. |
| 2013/0257421 A1 | 10/2013 | Shang et al. |
| 2013/0304399 A1 | 11/2013 | Chen et al. |
| 2013/0336574 A1 | 12/2013 | Nasser-Ghodsi et al. |
| 2014/0154529 A1 | 6/2014 | Yang et al. |
| 2014/0175050 A1 | 6/2014 | Zhang et al. |
| 2015/0117754 A1 | 4/2015 | Nasser-Ghodsi et al. |

\* cited by examiner

METHOD AND SYSTEM FOR DETECTING HOTSPOTS FOR PHOTOLITHOGRAPHICALLY-DEFINED DEVICES

BACKGROUND

Magnetic recording devices such as read or write heads as well as other micro devices are fabricated using photolithography. Typically, a photoresist layer is deposited. Selected areas of the photoresist layer are exposed to light. Corresponding portions of the photoresist layer are removed, forming a photoresist mask. One or more layers below apertures the photoresist mask may be removed or one or more layers deposited to form structures in the apertures. The photoresist mask is removed. This process is repeated to fabricate other layers in the photolithographically defined device. The device may thus be formed layer by layer.

Overlay refers to the match (or mismatch) between the desired locations of structures in different layers of the device. If a substrate were to be considered a planar surface described by x and y coordinates (z is perpendicular to the surface), then overlay error may be considered to be the actual x and y coordinates of a structure versus the designed x and y coordinates based on the previous layer(s). For example, the pole tip of a writer and a read sensor of a reader may be desired to be aligned in the cross-track direction. These structures are part of different layers formed at different times. Misalignments between the read sensor and pole tip may be due to overlay errors.

Overlay errors may be due to a variety of factors. For example, optical distortions may occur in the apparatus used to expose the photoresist to light. These distortions can cause offsets in the locations of regions exposed to light. The structures being formed may, therefore, be offset from their desired location and, therefore, be subject to overlay error. Another source of overlay error is hot spots. Hot spots occur because particulate contamination on the back side of the substrate. These micrometer to nanometer sized particles become trapped between the substrate and the holder, causing the substrate to deform. This deformation may result in a distortion of the features in the image being transferred to the substrate. Thus, significant overlay errors in the local area of the particle. The region in which such errors occur is termed a hot spot.

Figure 1:
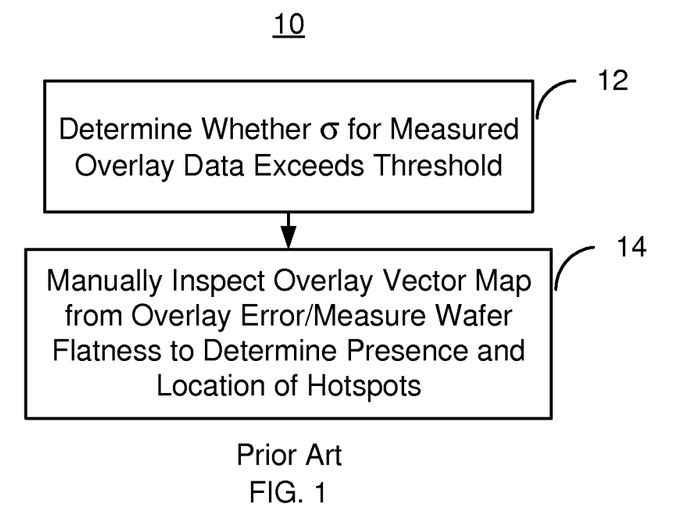
FIG. 1 depicts a conventional method for investigating overlay errors for a photolithographically defined device.

FIG. 1 depicts a conventional method for interrogating overlay errors that may be due at least in part to the presence of hot spots. The overlay data has been measured for one or more layers on the substrate. Based on this data, it is determined whether the overlay error (as measured by a) exceeds a particular threshold, via step 12. If so, then the wafer is further inspected, via step 14. In some cases, the inspection takes the form of a highly trained operator inspecting the overlay vector map. The overlay vector map indicates the magnitude and direction of distortions in the overlay. The operator may thus manually determine whether hotspots are present based on the character of the overlay vector map. Alternatively, the flatness of the substrate may be measured in a tool. These procedures may determine that there are small regions in which the overlay error is significant. These localized regions of high overlay error may correspond to the locations of hotspots. Thus, the presence and location of hotspots may be determined. A determination may then be made as to whether to pass the substrate for further processing, discard the substrate or rework the substrate due to the overlay error.

Although the conventional method 10 provides a mechanism for detecting and addressing overlay error, it is time consuming, less sensitive to hot spots than desired and operator dependent. Consequently, additional methods for dealing with overlay error are desired.

DETAILED DESCRIPTION OF THE PREFERRED EMBODIMENTS

Figure 2:
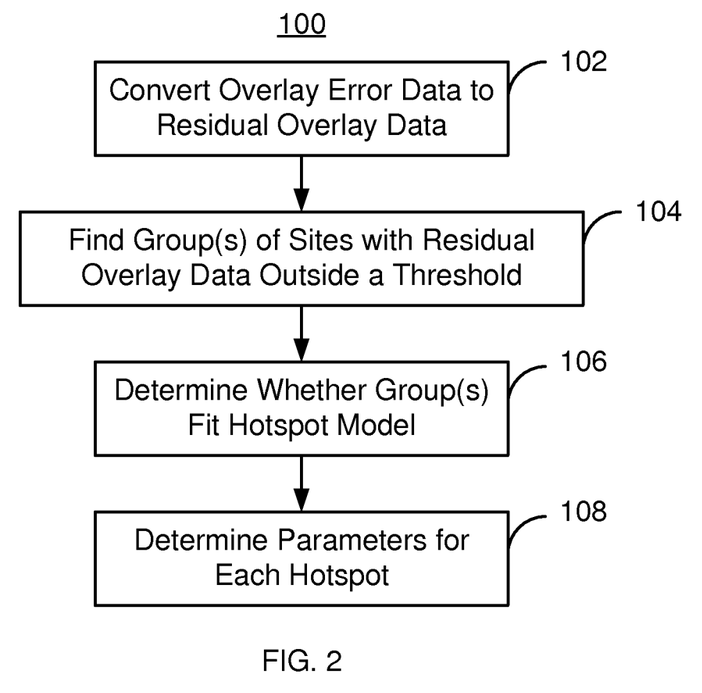
FIG. 2 is a flow chart depicting an exemplary embodiment of a method for detecting hot spots using a physical model of hotspots.
Figure 3:
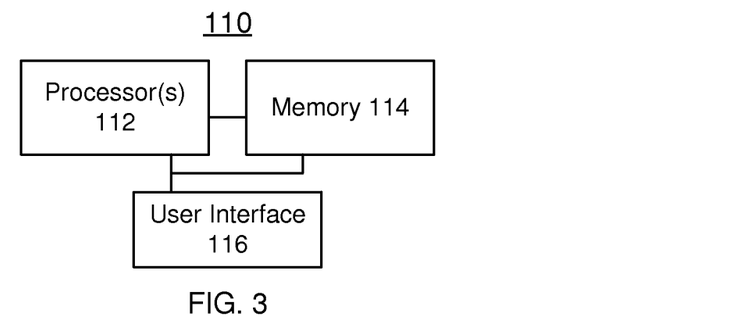
FIG. 3 depicts an exemplary embodiment of a system for detecting hot spots using overlay data and a physical model of the hot spots.

FIG. 2 is a flow chart depicting an exemplary embodiment of a method 100 for detecting hot spots for a photolithographically defined device using a physical model of the hot spots. For simplicity, some steps may be omitted, interleaved, performed in another order and/or combined. Each step may also include multiple substeps. The method 100 may be performed by one or more software components executing on one or more processors. For example, FIG. 3 is a block diagram a computing system 110 including processor(s) 112, memory 114 and user interface 116 that may be used in performing the method 100. The computing system 110 may be stand-alone or may be incorporated into an existing tool used in fabrication lines. For example, the computing system 110 may be part of an overlay measurement tool and/or an exposure tool. Referring to FIGS. 2-3, the method 100 is also described in the context of fabrication of a magnetic recording device, such as a read and/or write head residing on an AlTiC substrate. However, the method 100 may be used to detect hot spots for other devices and/or other substrates. In addition, one of ordinary skill in the art will recognize that multiple devices are generally fabricated on a single substrate. The method 100 uses overlay error data for the photolithography defined device(s). The overlay error data corresponds to data measured at sites on the substrate. For example, the overlay data may include spatial (e.g. x-y) variations in the locations of various structures measured at particular sites on the substrate. The locations may simply be a grid of sites across the surface of the substrate. For example, an array of sites across the surface of an AlTiC substrate on which multiple read and/or write heads are being fabricated may be used for obtaining overlay data for the method 100.

The overlay error data is converted to residual overlay data, via step 102. The overlay error data is the overlay error measured at each of the sites. The residual overlay data includes a residual overlay error for each of the sites. The residual overlay error is based on an expected overlay error for each site and the (measured) overlay error data. Stated differently, the expected overlay error may be removed from the overlay error data measured at each of the sites so that the residual overlay data remains for each site. For example, expected variations in locations of structures due to image distortion in the apparatus used to expose the photoresist may be modeled and subtracted from the overlay error data. These expected variations may be determined by a least squares regression fit of the measured overlay data at each site to a model for the image distortions (terms model). In other embodiments, other methods for removing other sources of overlay error from the overlay error data may be employed. Because the expected other sources of overlay error are removed from the overlay error data, the residual overlay data more closely corresponds to overlay errors due to hot spots.

It is determined whether one or more groups of sites having a large residual overlay error are present, via step 104. Step 104 includes determining sites that have a residual overlay error that exceeds a threshold. This determination may be accomplished mathematically using well known criteria. Any site having a residual overlay error greater than the threshold is deemed an outlier. Each group includes outliers that are nearest neighbors and that form a contiguous group. Each group thus includes a minimum of two nearest neighbor sites. Step 104 may include determining whether an outlier has a nearest neighbor outlier. If so, these two outliers/sites are collected together to form an initial group. It is determined whether there is a nearest neighbor outlier to any member of the initial group. If so, this new outlier is also made part of the group (e.g. forming an intermediate group). This process is continued on the intermediate group until the intermediate group contains all nearest neighbor outliers to those outliers already part of the intermediate group. Stated differently, the intermediate group is grown until there are no more nearest neighbor outliers. This final intermediate group is a group determined in step 104. The process may then be repeated for other outliers, forming other groups.

For each group of outliers formed in step 104, it is determined whether the group fits a physical model for a hotspot, via step 106. Each group that fits the physical model may be categorized as a hotspot. The physical model used in step 106 may be based on a Gaussian curve.

Figure 4:
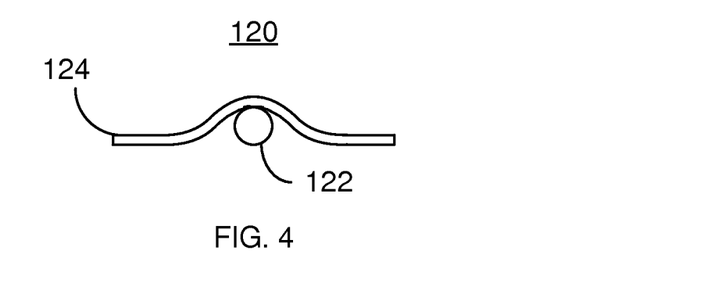
FIG. 4 depicts a portion of a substrate and a hotspot.
Figure 5:
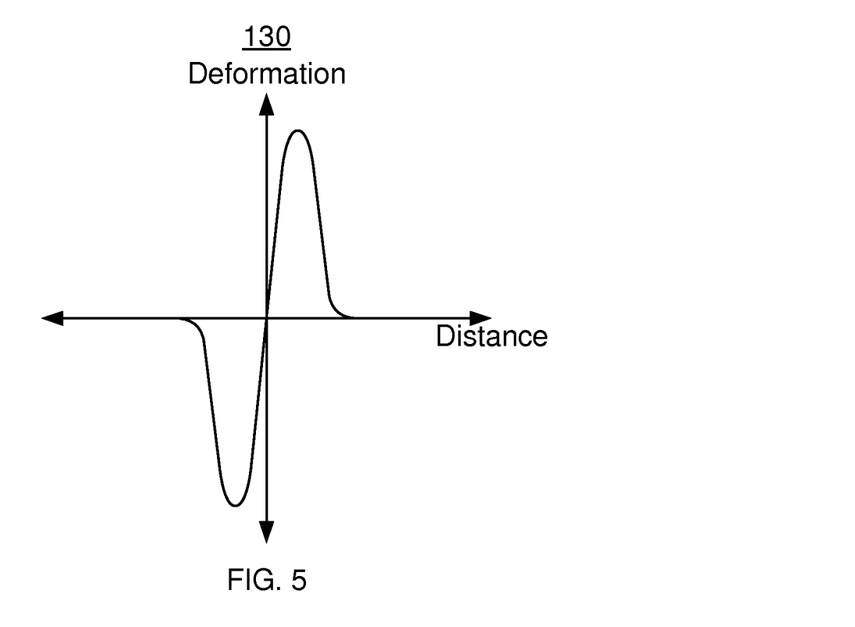
FIG. 5 depicts an exemplary embodiment of a physical model for a hot spot.

FIG. 4 depicts a substrate 120 during fabrication of photolithographically defined devices. A portion 124 of the substrate 120 is shown. A particle 122 is adjacent to the back side of the part 124 of the substrate 120. The particle 122 may be trapped between a chuck (not shown) that holds the substrate 120 and the substrate 120 itself. In the region 124, the substrate 120 deforms. The deformation is based upon the geometry and location of the particle 122 and may be approximated by a Gaussian curve. The residual overlay error due to the particle 122 corresponds to the deformation in the x-y plane described by a spatial derivative of the Gaussian. The residual overlay error may, therefore, be approximated by the first order spatial derivative of the Gaussian. FIG. 5 is a graph 130 depicting the first order spatial derivative of a Gaussian. The residual overlay error, E, that is the first spatial derivative of a Gaussian is given by:

$$E = A * \{(x-x_0),(y-y_0)\} * [\exp(1/2)/w] * \exp[(-(x-x_0)^2 - (y-y_0)^2)/(2*w^2)]$$

where the hot spot is centered on the point $(x_0, y_0)$, has a width w and an amplitude A. In other embodiments, other and/or additional models for the overlay error due to hot spots may be used. For example, higher order corrections may be added to the Gaussian model described above.

Determining whether each group fits the above physical model for a hot spot may include multiple substeps. For example, a polygon may be determined for each group. The polygon encompasses all of the outliers (e.g. sites having residual overlay error greater than the threshold) in the group. The polygon may be a convex polygon. In addition, the polygon may be the smallest convex polygon that includes all of the outliers for the group. It may then be determined whether a circularness for the shape of the polygon for the group exceeds a particular threshold. The circularness of a polygon indicates how closely its perimeter and area match those of a circle. For example, a circularness parameter may be $4\pi$(polygon area)/(polygon perimeter)$^2$. The closer the circularness parameter is to one, the more the polygon matches a circle. If the circularness for the polygon does not exceed the threshold, the group may be discarded. This allows for groups of outliers that are a line or otherwise uncharacteristic of hot spots to be removed from consideration. The remaining groups having a sufficiently high circularness are hot spot candidates.

For each hot spot candidate, initial guesses for the amplitude (initial amplitude) and width (initial width) are made. In some embodiments, the initial amplitude is the largest overlay error in the group/hot spot candidate. The initial width may be determined based upon the radius of a circle having an area substantially equal to a polygon area of the polygon. A fitted width and a fitted amplitude are calculated for each hot spot candidate using the initial amplitude and the initial width and the physical model described above. Any hot spot having a fitted width less than the minimum spacing between sites may be rejected. This allows for calculated hot spots smaller than the distance between sites where data was measured to be rejected. A hotspot having the fitted width and the fitted amplitude being determined for each of the remaining hot spot candidate.

For each group of overlay error sites that fits the physical model, the parameters are determined, via step 108. For example, the location of the center $(x_0, y_0)$, the amplitude and the width may be determined. Thus, the size, number and amplitude of the hotspot(s) may be determined. A decision may then be made as to whether to accept/pass the substrate for further processing, discard the substrate because the overlay errors are too large, or rework the substrate to attempt to correct errors in the overlay.

Using the method 100, hot spots may be automatically determined using overlay error data. More specifically, hot spots may be more quickly and easily found and quantified. For example, hot spots that may affect the alignment of the read sensor (not shown) and write pole (not shown) may be more rapidly identified and characterized. It may then be more easily determined whether to pass the substrate on for further processing, rework the substrate or discard the substrate. Because an operator no longer is required to manually inspect the overlay error and make such decisions, less time and training may be invested in the operator. In addition, operator bias and error in identification of the hot spots may be avoided. Thus, yield may be improved. The hot spot data determined using the method 100 may also remain available for later use, for example in improving production processes and reducing particulate contamination that gives rise to hot spots. Thus, fabrication of photolithographically defined devices, such as magnetic data storage devices, may be improved.

Figure 6:
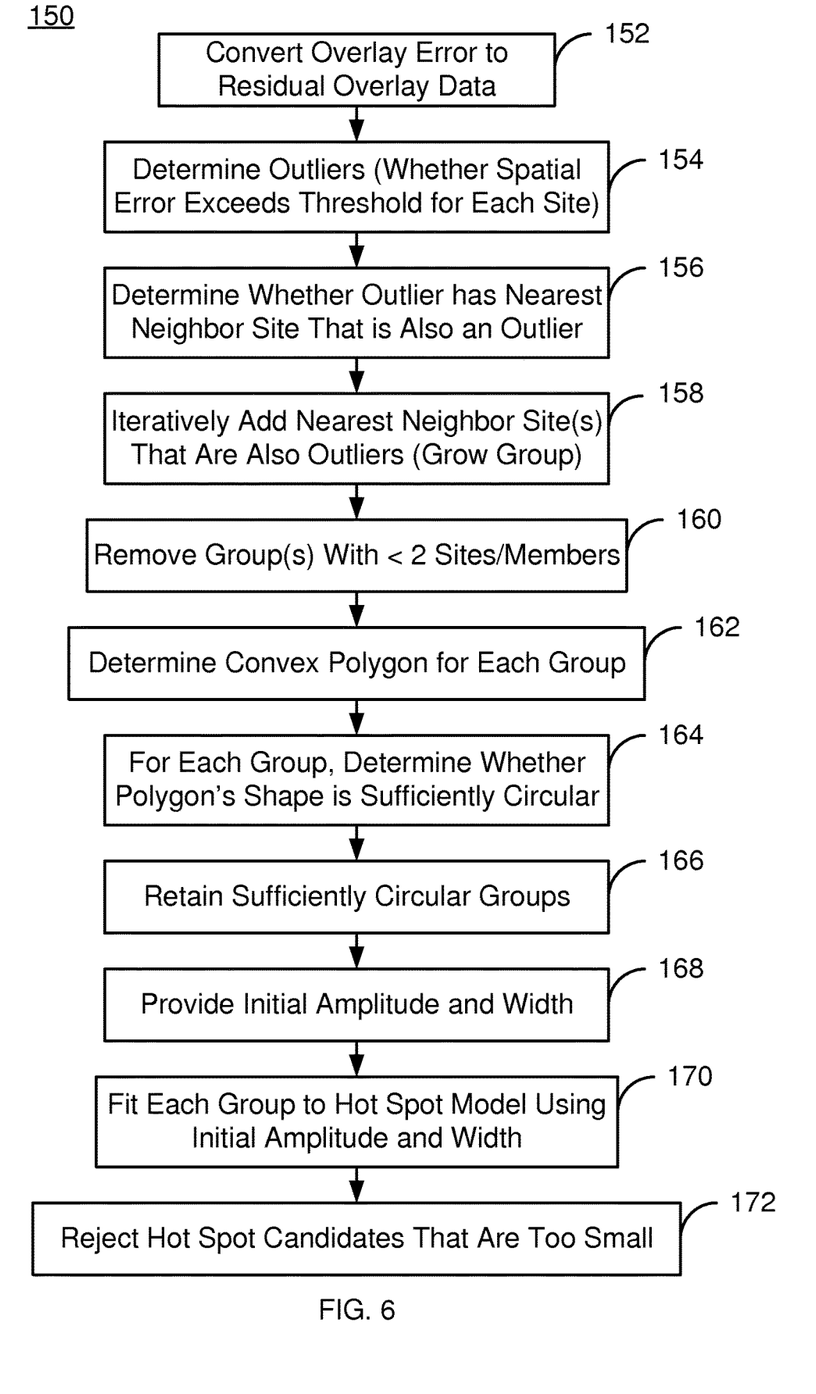
FIG. 6 is a flow chart depicting another exemplary embodiment of a method for detecting hot spots using a physical model of hotspots.

FIG. 6 is a flow chart depicting an exemplary embodiment of a method 150 for determining and characterizing hot spots for a photolithographically defined device using a physical model of the hot spots. For simplicity, some steps may be omitted, interleaved, performed in another order, combined and/or include substeps. The method 150 may be performed by one or more software components executing on one or more processors. For example, the method 150 may be implemented using the computing system 110 of FIG. 3. The method 150 is also described in the context of fabrication of a magnetic recording device, such as a read and/or write head residing on an AlTiC substrate. However, the method 150 may be used to detect hot spots for other devices and/or other substrates. In addition, one of ordinary skill in the art will recognize that multiple devices are generally fabricated on a single substrate. The method 150 uses overlay error data for the photolithography defined device(s). The overlay error data may be taken at an array of sites across the surface of the substrate on which multiple photolithographically defined devices are being fabricated. The method 150 is also analogous to the method 100. The overlay error data is spatial error data. Thus, the overlay error data may indicate a distance and direction that the structure for each site is offset. For example, the surface of a substrate may be described using x and y coordinates. The overlay error data indicates the offset in the ±x direction and/or the ±y direction for each site.

The overlay error data is converted to residual overlay data, via step 152. Step 152 is analogous to step 102. The residual overlay error is based on an expected overlay error for each site and the (measured) overlay error data. In step 152, the expected overlay error may be removed from the overlay error data measured at each of the sites so that the residual overlay data remains for each site. Because the expected other sources of overlay error are removed from the overlay error data, the residual overlay data more closely corresponds to overlay errors due to hot spots. The residual overlay error data is spatial error data, indicating the error of shift in the data at each site.

It is determined whether the spatial error data (i.e. the residual overlay error data) for each site exceeds a spatial error threshold, via step 154. This determination may be made using iterative calculations. Each site having the spatial error exceeding the spatial error threshold is considered to be an outlier. Thus, the outliers for the substrate are determined in step 154.

For the each outlier, it is determined whether another outlier is a nearest neighbor to the outlier, via step 156. The two nearest neighbor outliers form a current group.

The step of determining whether a nearest neighbor outlier exists for the outliers in the current group and adding these nearest neighbor outliers is repeated, via step 158. This step continues to be repeated until no additional nearest neighbor outliers are found. Thus, step 158 grows the current group until the current group no possible additional members are found. Thus, steps 156 and 158 form contiguous group(s) of outliers. Thus, steps 156 and 158 result in intermediate groups. Thus, the intermediate groups resulting may include those with individual outliers (which never grow) and those with multiple neighboring outliers (which have been grown).

If there are any intermediate groups with fewer than two nearest neighbor outliers as members, the intermediate group(s) are discarded, via step 160. Thus, any intermediate group with only a single site/outlier as a member is removed from consideration. Because they have an insufficient number of members, such individual outliers are deemed unlikely to be due to hot spots. The remaining groups include multiple, contiguous, nearest neighbor outliers. In an alternate embodiment, step 160 may be omitted. Steps 154, 156, 158 and 160 may be considered to be analogous to step 104 of the method 100.

For each group, the shape of a convex polygon including all of the outliers in the group is determined, via step 162. Various mechanisms for obtaining the polygons may be used in step 162. For example, a Jarvis March or gift wrap algorithm might be used. It is also determined whether the shape of the polygon for each group is sufficiently circular, via step 164. Step 164 may thus determine whether the circularness for the shape of the polygon for the group exceeds a particular threshold. Step 164 may include comparing the area of the shape to the perimeter. The groups for which the circularness for the polygon exceeds the threshold are retained, via step 166. Other groups are discarded. In other embodiments, other thresholds and/or other relationships may be used. For example, groups having a circularness of greater than or equal to the threshold might be retained. The remaining groups having a sufficiently high circularness are hot spot candidates.

For each hot spot candidate, initial guesses for the amplitude (initial amplitude) and width (initial width) are provided, via step 168. The initial amplitude may be the largest overlay error in the group/hot spot candidate. The initial width may be determined based upon the radius of a circle having an area substantially equal to a polygon area of the polygon. Each hot spot candidate is fitted to a physical model using the initial amplitude and initial width, via step 170. The physical model may be the spatial derivative of a Gaussian curve. In some embodiments, another physical model may be used or the gradient of the Gaussian may be supplemented with higher order corrections. For a Gaussian, a fitted width and fitted amplitude may be obtained in step 170. The fitted width for each hot spot candidate is checked against the spacing between sites. Any hot spot candidate having a fitted width less than the minimum spacing between sites are rejected, via step 172. Thus, steps 162, 164, 166, 168, 170 and 172 are thus analogous to step 106 of the method 100.

The fitted hot spot candidates may then be used to make various determinations. For example, the location of the center ($x_0$, $y_0$), the amplitude and the width may be determined from the fitted amplitude and fitted width obtained in step 170. Thus, the size, number and amplitude of the hotspot(s) may be determined. Further decisions may be made on the individual substrate tested. The data may also be used prospectively to improve processing of photolithographically defined devices.

The method 150 may share the benefits of the method 100. Hot spots may be more quickly and easily found and quantified. Decisions may be more quickly made on how to treat the substrate, for example whether to rework the substrate, and the data may be used to alter processing parameters to improve fabrication of devices on subsequent substrates. Operator bias and error may be avoided and yield improved. Thus, fabrication of photolithographically defined devices, such as magnetic data storage devices, may be improved.

Figure 7:
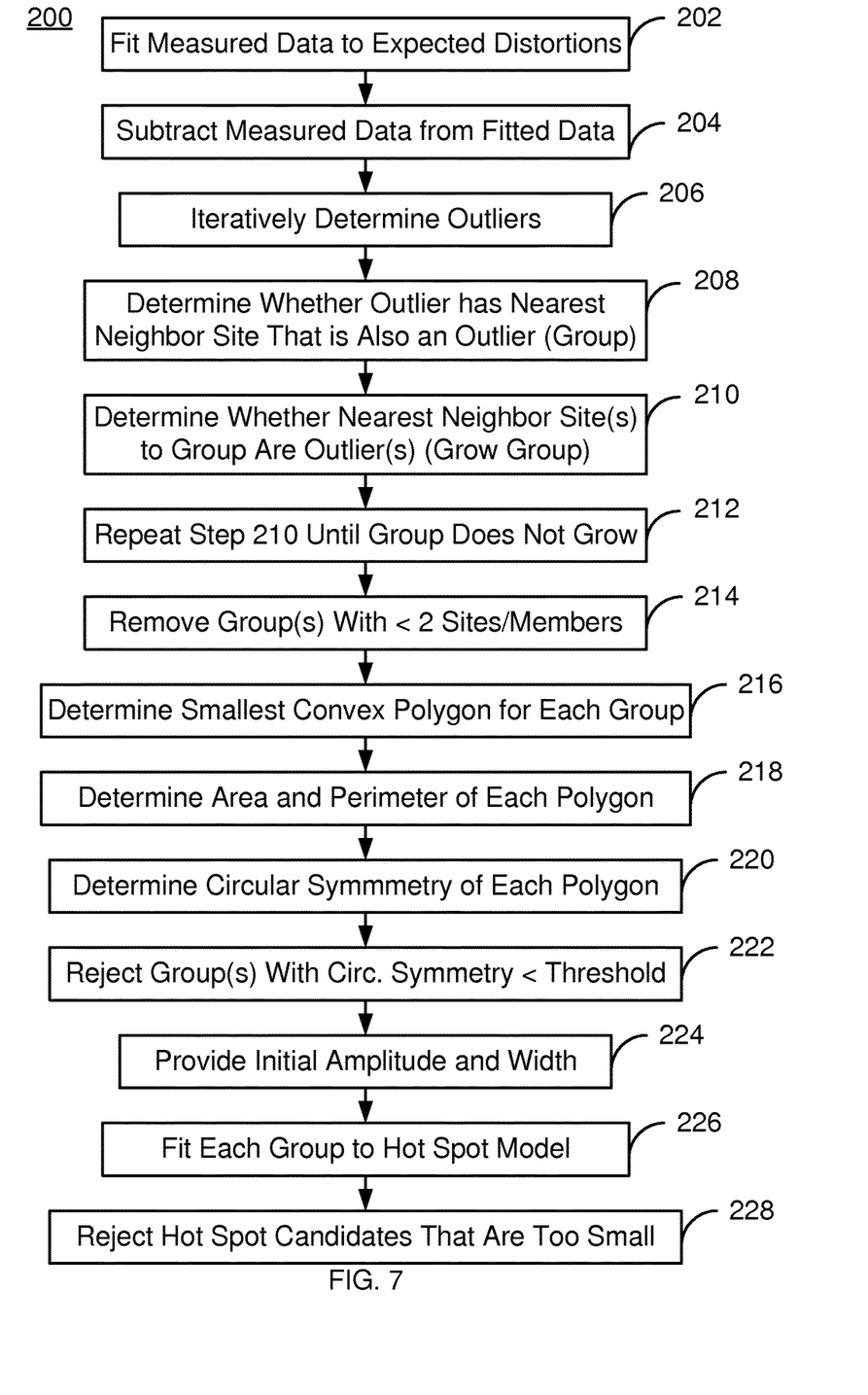
FIG. 7 is a flow chart depicting another exemplary embodiment of a method for detecting hot spots using a physical model of hotspots.

FIG. 7 is a flow chart depicting an exemplary embodiment of a method 200 for determining and characterizing hot spots for a photolithographically defined device using a physical model of the hot spots. For simplicity, some steps may be omitted, interleaved, performed in another order, combined and/or include substeps. The method 200 may be performed by one or more software components executing on one or more processors. For example, the method 200 may be implemented using the computing system 110 of FIG. 3. The method 200 is also described in the context of fabrication of a magnetic recording device, such as a read and/or write head residing on an AlTiC substrate. However, the method 200 may be used to detect hot spots for other devices and/or other substrates. In addition, one of ordinary skill in the art will recognize that multiple devices are generally fabricated on a single substrate. The method 200 uses overlay error data for the photolithography defined device(s). The overlay error data may be taken at an array of sites across the surface of the substrate on which multiple photolithographically defined devices are being fabricated. The method 200 is also analogous to the method 100 and/or 150. The overlay error data is spatial error data. Thus, the overlay error data may indicate a distance and direction that the structure for each site is offset. For example, the surface of a substrate may be described using x and y coordinates. The overlay error data indicates the offset in the ±x direction and/or the ±y direction measured for each site.

The (measured) overlay error data is fit to expected distortions, via step 202. For example, the measured overlay error data may be least squares regression fit to the terms model for image distortions. The result of step 202 may be termed the fitted overlay data.

The fitted overlay data is subtracted from the measured overlay error data, resulting in residual overlay data, via step 204. Step 202 and 204 are analogous to step 102 and 112. The residual overlay error more closely corresponds to overlay errors due to hot spots. The residual overlay error data is spatial error data, indicating the error of shift in the data at each site.

It is iteratively determined whether the residual error data for each site exceeds a spatial error threshold using Chauvenet's criteria, via step 206. Each site having the spatial error exceeding the spatial error threshold is an outlier. Thus, the outliers for the substrate are determined in step 206.

For the each outlier, it is determined whether another outlier is a nearest neighbor to the outlier, via step 208. The two nearest neighbor outliers form a current group. For each current group, it is determined whether there are nearest neighbor outliers for the members of the current group, via step 210. Step 210 may then repeated, adding outliers to the current group, until the current group no longer grows, via step 212. Stated differently, step 210 is repeated until no additional nearest neighbor outliers are found for members of the group. If there are any groups with fewer than two nearest neighbor outliers as members, the intermediate group(s) are removed from consideration, via step 214. Thus, any intermediate group with only a single site/outlier as a member is removed from consideration. Each of the remaining groups include multiple, contiguous, nearest neighbor outliers. Steps 204, 206, 208, 210 and 212 may be considered to be analogous to step 104 of the method 100.

For each group, the smallest convex polygon including all of the outliers in the group is determined, via step 214. Stated differently, the convex hull for each group is determined in step 214. Various mechanisms, such as a Jarvis March or gift wrap algorithm, might be used in step 214.

The area and perimeter of each polygon is determined, via step 216. The area may be computed using Green's theorem implemented as a shoelace algorithm. However, other mechanisms for determining the polygon areas may be used. The perimeter of each polygon may be calculated by summing the length of all vector differences for the convex hull that was determined in step 214.

The shape value of each polygon is determined, via step 220. In some embodiments, step 220 includes determining the circularness for each polygon. The circularness for a group may be the quantity $4\pi$(polygon area)/(polygon perimeter)$^2$. The circularness of a circles is one. In other embodiments, another mechanism may be used to determine the circularness of the polygon for each group.

Groups that have a circularness that does not exceed a threshold are discarded, via step 222. In some embodiments, groups having polygons with a circularness of less than or equal to 0.5 are discarded. In other embodiments, other thresholds and/or other relationships may be used. For example, groups having a circularness of less than 0.5 might be removed. The remaining groups are hot spot candidates.

For each remaining group, initial guesses for the amplitude (initial amplitude) and width (initial width) are provided, via step 224. The initial amplitude may be the largest overlay error in the group/hot spot candidate. The initial width may be determined based upon the radius of a circle having an area substantially equal to a polygon area of the polygon for the remaining group.

Each hot spot candidate is fitted to a physical model using the initial amplitude and initial width, via step 226. The physical model may be the spatial derivative of a Gaussian curve. In some embodiments, another physical model may be used or the gradient of the Gaussian may be supplemented with higher order corrections. For a Gaussian, a fitted width and fitted amplitude may be obtained in step 226. The fitted width for each hot spot candidate is checked against the spacing between sites. Any hot spot candidate having a fitted width less than the minimum spacing between sites are rejected, via step 228. The remaining hot spot candidates are deemed hot spots. Thus, steps 216, 218, 220, 222, 224, 226 and 228 are thus analogous to step 106 of the method 100. The location of the center ($x_0$, $y_0$), the amplitude and the width for the hot spot may be determined from the fitted amplitude and fitted width. Thus, the size, number and amplitude of the hotspot(s) may be determined.

The method 200 may share the benefits of the methods 100 and/or 150. Hot spots may be more quickly and easily found and quantified. Decisions may be more quickly made on how to treat the substrate, for example whether to rework the substrate, and the data may be used to alter processing parameters to improve fabrication of devices on subsequent substrates. Operator bias and error may be avoided and yield improved. Thus, fabrication of photolithographically defined devices, such as magnetic data storage devices, may be improved.

What is claimed is:

1. A method for detecting hot spots from overlay error data for at least one photolithography defined device, the overlay error data corresponding to data for a plurality of sites on a substrate for the at least one photolithography defined device, the method comprising:
   converting the overlay error data to residual overlay data indicating a residual overlay error for each of the plurality of sites, the residual overlay error being based on an expected overlay error for each of the plurality of sites;
   determining whether at least one group of overlay error sites is present in the residual overlay data, each of the at least one group including at least two nearest neighbor sites of the plurality of sites, each of the at least two nearest neighbor sites having the residual overlay error greater than a threshold;
   for each of the at least one group of overlay error sites present, determining whether each of the at least one group of overlay error sites fits a physical model for a hotspot, each of the at least one group of overlay error sites fitting the physical model being categorized as a hotspot; and determining a plurality of parameters for the hotspot for each of the at least one group of overlay error sites that fits the physical model, wherein the step of determining whether each of the at least one group of overlay error sites fits a physical model for a hotspot further includes:

determining a shape of a polygon for each of the at least one group of overlay error sites;

determining whether the shape has a circularness exceeding a shape threshold; and retaining at least a portion of the plurality of the groups of overlay error sites having the circulamess exceeding the threshold to provide at least one hot spot candidate.

2. The method of claim 1 wherein the physical model is a Gaussian-based curve and the plurality of parameters include an amplitude, a width and a center location.

3. The method of claim 1 wherein the residual overlay data includes spatial error data and wherein the step of determining whether the at least one group of overlay error sites exists further includes:

determining whether a spatial error in the overlay error data for each of plurality of sites exceeds a spatial error threshold for each of the plurality of sites, each spatial error exceeding the spatial error threshold being an outlier;

for each of the outlier, determining whether an other outlier corresponding to an other site is in proximity to the outlier for a site, the other outlier and the outlier forming a current group; and for each current group, repeating the determining step for the current group until the current group does not grow, thereby providing the at least one intermediate group.

4. The method of claim 3 wherein the step of determining the at least one group of overlay error sites further includes:

for each of the at least one intermediate group, rejecting any group including only a single site to provide the at least one group of overlay error sites.

5. The method of claim 1 wherein the step of determining whether each of the at least one group of overlay error sites fits a physical model for a hotspot further includes:

providing an initial amplitude and an initial width for each of the at least one hot spot candidate based on a largest overlay error and a circle having an area substantially equal to a polygon area of the polygon; and calculating a fitted width and a fitted amplitude for each of the at least the at least one hot spot candidate using the initial amplitude and the initial width, a hotspot having the fitted width and the fitted amplitude being determined for each of the at least the portion of the plurality of groups of overlay error sites.

6. The method of claim 1 wherein the step of determining the plurality of parameters further includes:

rejecting any hotspot having a fitted width less than a minimum spacing between the plurality of sites to provide at least one hotspot.

7. The method of claim 1 wherein the expected overlay error is an expected image distortion error.

8. The method of claim 1 further comprising:

determining whether to rework the substrate based on the plurality of parameters for each hotspot.

9. The method of claim 1 wherein the method is performed by at least one software component executing on at least one processor.

10. The method of claim 1 wherein the at least one photolithography defined device is at least one data storage device.

* * * * *